(12) United States Patent
Tsukahara et al.

(10) Patent No.: US 10,847,348 B2
(45) Date of Patent: Nov. 24, 2020

(54) PLASMA PROCESSING APPARATUS AND PLASMA PROCESSING METHOD

(71) Applicant: Tokyo Electron Limited, Tokyo (JP)

(72) Inventors: Toshiya Tsukahara, Miyagi (JP); Shuhei Yamabe, Miyagi (JP); Kota Yachi, Miyagi (JP); Tetsuji Sato, Miyagi (JP); Yohei Uchida, Miyagi (JP); Ayuta Suzuki, Nirasaki (JP); Yosuke Tamura, Miyagi (JP); Hidetoshi Hanaoka, Miyagi (JP); Junichi Sasaki, Miyagi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days.

(21) Appl. No.: 16/699,953

(22) Filed: Dec. 2, 2019

(65) Prior Publication Data

US 2020/0176226 A1 Jun. 4, 2020

(30) Foreign Application Priority Data

Dec. 3, 2018 (JP) .................................. 2018-226567

(51) Int. Cl.
*H01J 37/32* (2006.01)

(52) U.S. Cl.
CPC .. *H01J 37/32568* (2013.01); *H01J 37/32174* (2013.01); *H01J 37/32541* (2013.01); *H01J 37/32642* (2013.01); *H01J 2237/3341* (2013.01)

(58) Field of Classification Search
CPC .......... H01J 37/32568; H01J 37/32642; H01J 37/32541; H01J 37/32174; H01J 2237/3341
See application file for complete search history.

(56) References Cited

U.S. PATENT DOCUMENTS

2006/0037703 A1* 2/2006 Koshiishi .......... H01J 37/32082
156/345.47
2008/0006205 A1* 1/2008 Keil .................. H01J 37/32091
118/723 E
2009/0242515 A1* 10/2009 Honda .............. H01J 37/32027
216/67

(Continued)

FOREIGN PATENT DOCUMENTS

JP 2009-239012 A 10/2009

*Primary Examiner* — Renan Luque
(74) *Attorney, Agent, or Firm* — Pearne & Gordon LLP (57) ABSTRACT

A plasma processing apparatus includes a processing vessel, a lower electrode, an annular member, an inner upper electrode, an outer upper electrode, a processing gas supply, a first high frequency power supply and a first DC power supply. The lower electrode is configured to place a processing target substrate. The annular member is disposed on an outer peripheral portion of the lower electrode. The inner upper electrode is disposed to face the lower electrode. The outer upper electrode is disposed at an outside of the inner upper electrode. The first high frequency power supply applies a first high frequency power. The first DC power supply applies a first variable DC voltage to the outer upper electrode. At least a part of a surface of the outer upper electrode exposed to the processing space is located higher than a surface of the inner upper electrode exposed to the processing space.

17 Claims, 8 Drawing Sheets

(56) References Cited

U.S. PATENT DOCUMENTS

| | | | |
|---|---|---|---|
| 2011/0235675 A1* | 9/2011 | Matsudo | H01L 21/6831 |
| | | | 374/130 |
| 2015/0206722 A1* | 7/2015 | Yamamoto | H01J 37/32715 |
| | | | 156/345.51 |
| 2016/0284522 A1* | 9/2016 | Eto | C23C 16/5096 |
| 2017/0338084 A1* | 11/2017 | Nishijima | H01J 37/32091 |
| 2018/0076028 A1* | 3/2018 | Swaminathan | H01L 21/02348 |

* cited by examiner

PLASMA PROCESSING APPARATUS AND PLASMA PROCESSING METHOD

CROSS-REFERENCE TO RELATED APPLICATION

This application claims the benefit of Japanese Patent Application No. 2018-226567 filed on Dec. 3, 2018, the entire disclosure of which is incorporated herein by reference.

TECHNICAL FIELD BACKGROUND

The various aspects and embodiments described herein pertain generally to a plasma processing apparatus and a plasma processing method.

BACKGROUND

In semiconductor manufacture, a processing using plasma (hereinafter, referred to as "plasma processing") is widely used. In order to increase a yield of the semiconductor manufacture and improve a quality thereof, it is investigated to improve uniformity of the plasma processing such as etching by improving plasma uniformity within a surface of a semiconductor wafer as a processing target object.

By way of example, to improve uniformity of an etching rate, Patent Document 1 proposes a configuration in which an upper electrode within a plasma processing apparatus is divided in two parts, and a variable DC voltage is applied to each part of the upper electrode independently.

Patent Document 1: Japanese Patent Laid-open Publication No. 2009-239012

SUMMARY

In one exemplary embodiment, a plasma processing apparatus includes a processing vessel, a lower electrode, an annular member, an inner upper electrode, an outer upper electrode, a processing gas supply, a first high frequency power supply and a first DC power supply. The processing vessel is configured to be evacuated. The lower electrode is configured to place a processing target substrate within the processing vessel. The annular member is disposed on an outer peripheral portion of the lower electrode. The inner upper electrode is disposed to face the lower electrode within the processing vessel. The outer upper electrode is disposed in a ring shape at an outside of the inner upper electrode in a radial direction thereof within the processing vessel. Further, the outer upper electrode is electrically insulated from the inner upper electrode. The processing gas supply is configured to supply a processing gas into a processing space between the inner upper electrode and the outer upper electrode and the lower electrode. The first high frequency power supply is configured to apply, to the lower electrode or to the inner upper electrode and the outer upper electrode, a first high frequency power for forming plasma from the processing gas by a high frequency discharge. The first DC power supply is configured to apply a first variable DC voltage to the outer upper electrode. At least a part of a surface of the outer upper electrode exposed to the processing space is located higher than a surface of the inner upper electrode exposed to the processing space.

The foregoing summary is illustrative only and is not intended to be any way limiting. In addition to the illustrative aspects, embodiments, and features described above, further aspects, embodiments, and features will become apparent by reference to the drawings and the following detailed description.

BRIEF DESCRIPTION OF THE DRAWINGS

In the detailed description that follows, embodiments are described as illustrations only since various changes and modifications will become apparent to those skilled in the art from the following detailed description. The use of the same reference numbers in different figures indicates similar or identical items.

DETAILED DESCRIPTION

In the following detailed description, reference is made to the accompanying drawings, which form a part of the description. In the drawings, similar symbols typically identify similar components, unless context dictates otherwise. Furthermore, unless otherwise noted, the description of each successive drawing may reference features from one or more of the previous drawings to provide clearer context and a more substantive explanation of the current exemplary embodiment. Still, the exemplary embodiments described in the detailed description, drawings, and claims are not meant to be limiting. Other embodiments may be utilized, and other changes may be made, without departing from the spirit or scope of the subject matter presented herein. It will be readily understood that the aspects of the present disclosure, as generally described herein and illustrated in the drawings, may be arranged, substituted, combined, separated, and designed in a wide variety of different configurations, all of which are explicitly contemplated herein.

Hereinafter, exemplary embodiments of a plasma processing apparatus of the present disclosure will be described in detail with reference to the accompanying drawings. However, the present disclosure is not limited to the exemplary embodiments to be described below. Further, it should be noted that the drawings are schematic and relations in sizes of individual components and ratios of the individual components may sometimes be different from actual values. Even between the drawings, there may exist parts having different dimensional relationships or different ratios. Furthermore, the various exemplary embodiments can be appropriately combined as long as the contents of processings are not contradictory.

Exemplary Embodiment

In a plasma processing apparatus according to an exemplary embodiment, an upper electrode is divided into two parts: an inner upper electrode and an outer upper electrode, and a voltage applied to each part is controlled independently. The plasma processing apparatus according to the exemplary embodiment is configured such that at least a part of a surface of the outer upper electrode exposed to a processing space is higher than a surface of the inner upper electrode exposed to the processing space. For example, the outer upper electrode is provided with a recess recessed upwards to be higher than the surface of the inner upper electrode exposed to the processing space. By providing this recess, the processing space in which a plasma processing is performed can be enlarged in the vertical direction.

With this configuration, in the plasma processing apparatus according to the exemplary embodiment, a peak of an electron density within the processing space in a plasma processing is formed at a position above an outer periphery of a wafer, more desirably, at a position outer than the outer periphery of the wafer in a diametrical direction. By setting the peak of the electron density to be formed at the position above the outer periphery of the wafer or at the position outer than the outer periphery of the wafer, it becomes difficult for a variation of a tilt angle within a surface of the wafer to have an inflection point. Therefore, in the plasma processing apparatus according to the exemplary embodiment, controllability of tilting can be improved by setting a wide range for the voltage applied to the outer upper electrode. Further, with this structure, an influence of the tilting upon a portion of the wafer inner than an edge portion thereof can be suppressed.

Desirably, the plasma processing apparatus according to the exemplary embodiment is equipped with a focus ring having a diameter larger than that of a conventional focus ring. By way of example, the plasma processing apparatus according to the exemplary embodiment has a focus ring having an outer diameter corresponding to a position of the recess of the outer upper electrode. With this structure, in the plasma processing apparatus according to the exemplary embodiment, the peak of the electron density within the processing space can be formed at a position more outer than the outer periphery of the wafer in the diametrical direction. Hereinafter, the plasma processing apparatus according to the exemplary embodiment will be described with reference to the accompanying drawings.

In the present exemplary embodiment, as an example, the wafer has a size of 300 mm in diameter and 150 mm in radius. Further, the edge portion of the wafer refers to a ring-shaped portion ranging from about 135 mm to 150 mm in radius.

[Configuration Example of Plasma Processing Apparatus of Exemplary Embodiment]

Figure 1:
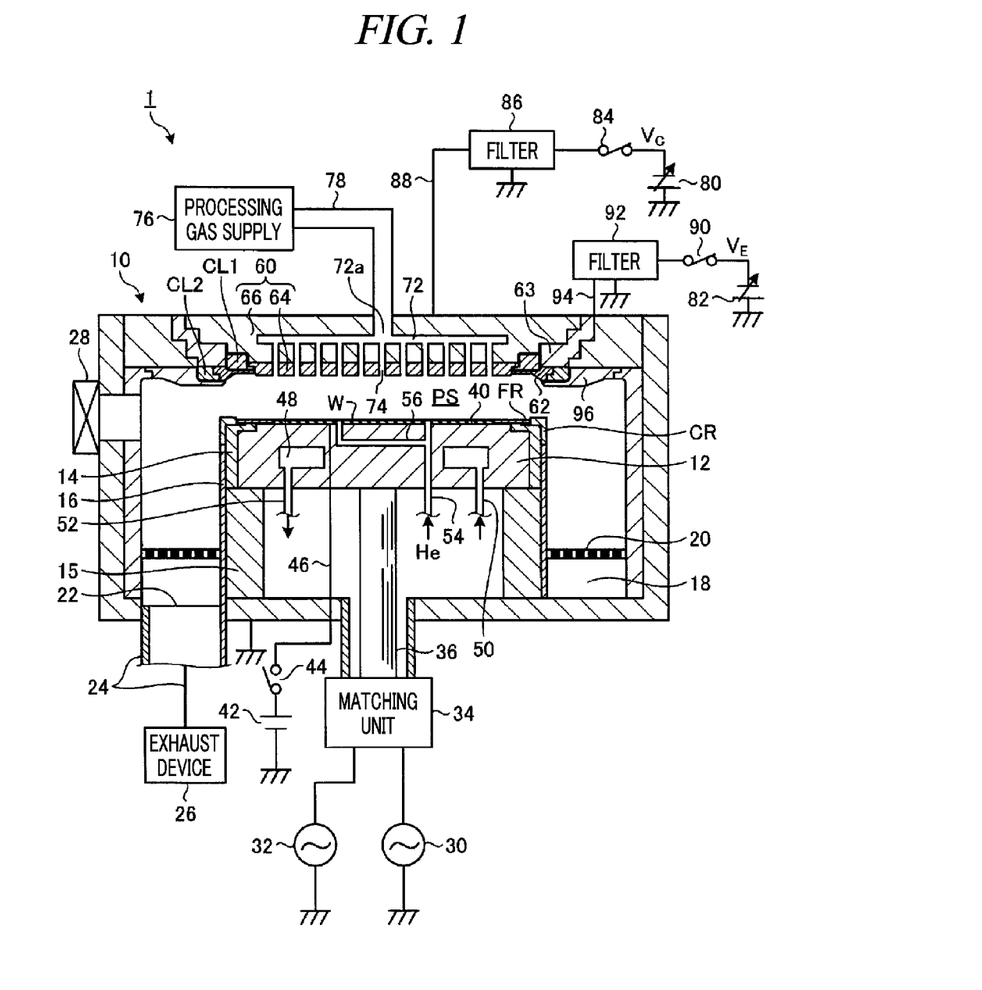
FIG. 1 is a diagram illustrating an example configuration of a plasma processing apparatus according to an exemplary embodiment.

FIG. 1 is a diagram illustrating an example configuration of a plasma processing apparatus 1 according to a first exemplary embodiment. This plasma processing apparatus 1 is configured as a cathode-coupled capacitively coupled plasma etching apparatus of a type in which dual high frequency powers are applied to a lower electrode. The plasma processing apparatus 1 has a cylindrical chamber (processing vessel) 10 made of a metal such as aluminum or stainless steel. The chamber 10 is frame-grounded.

A disk-shaped susceptor 12 configured to place thereon a semiconductor wafer W (hereinafter, simply referred to as "wafer W") as a processing target substrate is disposed within the chamber 10 horizontally to serve as a lower electrode. The susceptor 12 is made of, by way of non-limiting example, aluminum, and a first support 14 having a cylindrical shape and insulating property is disposed to surround the susceptor 12. A second support 15 made of an insulating material such as, but not limited to, quartz and having a substantially cylindrical shape is provided on a bottom of the chamber 10. Within the chamber 10, the second support 15 extends vertically from the bottom of the chamber 10. The second support 15 supports the susceptor 12. An annular exhaust path 18 is formed between a sidewall of the chamber 10 and a conductive cylindrical support (inner wall member) 16 which extends vertically upwards from the bottom of the chamber 10 along side surfaces of the first support 14 and the second support 15. A ring-shaped baffle plate (exhaust ring) 20 is provided at an inlet of the exhaust path 18, and an exhaust opening 22 is provided at a bottom of the exhaust path 18. An exhaust device 26 is connected to this exhaust opening 22 via an exhaust line 24. The exhaust device 26 has a vacuum pump such as a turbo molecular pump and is capable of decompressing a processing space within the chamber 10 to a required vacuum level. A gate valve 28 configured to open or close a carry-in/out opening for the wafer W is provided at the sidewall of the chamber 10.

The susceptor 12 is connected with a first high frequency power supply 30 and a second high frequency power supply 32 via a matching unit 34 and a power feed rod 36. Here, the first high frequency power supply 30 is configured to output a first high frequency power having a frequency (typically, equal or higher than 40 MHz) which contributes to plasma formation. The second high frequency power supply 32 is configured to output a second high frequency power having a frequency (typically, equal to or less than 13.56 MHz) which contributes to ion attraction into the wafer W on the susceptor 12. The matching unit 34 accommodates therein a first matching device configured to match an impedance of the first high frequency power supply 30 with an impedance at a load side (mainly, electrode, plasma and chamber); and a second matching device configured to match an impedance of the second high frequency power supply 32 and the impedance at the load side.

The wafer W as a processing target object is placed on the susceptor 12, and a focus ring (also called an annular ring) FR is disposed to surround the wafer W. The focus ring FR is made of a conductor such as, but not limited to, Si or SiC having less adverse influence upon a processing. The focus ring FR as a consumable component is provided on a top surface of the susceptor 12 in a detachable manner. Further, a cover ring CR is provided near an outer periphery of the focus ring FR to surround the focus ring FR. The cover ring CR is made of an insulator such as, by way of example, quartz. The cover ring CR serves to protect a top surface of the first support 14 from plasma.

An electrostatic chuck 40 configured to attract and hold the wafer is provided on a top surface of the susceptor 12. The electrostatic chuck 40 includes a film-shaped or plate-shaped dielectric member and a sheet-shaped or mesh-shaped conductor embedded in this dielectric member. The conductor is electrically connected with a DC power supply 42 provided at an outside of the chamber 10 via an on/off switch 44 and a power feed line 46. The wafer W is attracted to and held on the electrostatic chuck 40 by a Coulomb force generated by a DC voltage applied from the DC power supply 42.

An annular coolant path 48 extending in, for example, a circumferential direction is provided within the susceptor 12. A coolant of a preset temperature, for example, cooling water from a chiller unit (not shown) is supplied into and circulated in this coolant path 48 via pipelines 50 and 52. A temperature of the wafer W on the electrostatic chuck 40 can be controlled by the temperature of the coolant. Further, to improve accuracy of the temperature of the wafer, a heat transfer gas, for example, a He gas from a heat transfer gas supply (not shown) is supplied into a gap between the electrostatic chuck 40 and the wafer W through a gas supply line 54 and a gas passageway 56 within the susceptor 12.

A disk-shaped inner (or central) upper electrode 60 and a ring-shaped outer (or peripheral) upper electrode 62 are concentrically provided at a ceiling of the chamber 10, facing the susceptor 12 in parallel. With regard to proper sizes thereof in a diametrical direction, a bottom surface of the inner upper electrode 60 has a diameter substantially equal to a diameter of the wafer W, and the outer upper electrode 62 has a diameter (inner diameter/outer diameter) substantially equal to that of the focus ring FR. Desirably, the diameter of the outer upper electrode 62 is larger than the diameter of the focus ring FR. The inner upper electrode 60 and the outer upper electrode 62 are insulated from each other electrically (more accurately, DC-wise). In the shown configuration example, a gap is provided between the two electrodes 60 and 62. In another example, a ring-shaped insulator may be inserted in this gap.

The inner upper electrode 60 includes an electrode plate 64 directly facing the susceptor 12 and an electrode support 66 (cooling plate) configured to support the electrode plate 64 from behind (above) it in a detachable manner. Desirably, the electrode plate 64 is made of a silicon-containing conductor such as Si or SiC having less adverse influence upon a processing and capable of maintaining a good DC application characteristic. The electrode support 66 may be made of alumite-treated aluminum. The electrode plate 64 is coupled to the electrode support 66 by being held with a clamp member CL1. The clamp member CL1 is made of, by way of non-limiting example, ceramic.

The outer upper electrode 62 is disposed to face the susceptor 12. The outer upper electrode 62 is made of the same material as the inner upper electrode 60. The outer upper electrode 62 is coupled to a ceiling of the chamber 10 by a clamp member CL2 disposed near an outer periphery thereof. The clamp member CL2 is made of, by way of example, ceramic. Though not shown in FIG. 1, the clamp member CL2 has a preset clearance with respect to an adjacent grounding member 96 (to be described later). Further, a preset clearance is also provided between the clamp member CL1 and the outer upper electrode 62 and the electrode plate 64. Further, a preset clearance is provided between the outer upper electrode 62 and the grounding member 96 (see FIG. 2).

In the exemplary embodiment, to supply a processing gas into a processing space PS between the upper electrodes 60 and 62 and the susceptor 12, the inner upper electrode 60 is configured to serve as a shower head. To elaborate, a gas diffusion space 72 is provided within the electrode support 66, and a multiple number of gas discharge holes 74 is formed through the electrode support 66 and the electrode plate 64 to extend from the gas diffusion space 72 toward the susceptor 12. A gas inlet 72a is provided at an upper portion of the gas diffusion space 72, and a gas supply line 78 led from a processing gas supply 76 is connected to the gas inlet 72a. Further, the outer upper electrode 62 as well as the inner upper electrode 60 may be configured as the shower head.

Two variable DC power supplies 80 and 82 configured to output a first DC voltage VC and a second DC voltage VE, respectively, in a range from, e.g. −2000 V to +1000 V are disposed at the outside of the chamber 10.

An output terminal of the variable DC power supply 80 is electrically connected to the inner upper electrode 60 via an on/off switch 84 and a filter circuit 86. The filter circuit 86 is configured to apply the first DC voltage VC outputted from the variable DC power supply 80 to the inner upper electrode 60, while passing a high frequency power reaching a DC power supply line 88 from the susceptor 12 through the processing space PS and the inner upper electrode 60 to a ground line such that this high frequency power does not flow to the variable DC power supply 80.

An output terminal of the variable DC power supply 82 is electrically connected to the outer upper electrode 62 via an on/off switch 90 and a filter circuit 92. The filter circuit 92 is configured to apply the second DC voltage VE outputted from the variable DC power supply 82 to the outer upper electrode 62, while passing a high frequency power reaching a DC power supply line 94 from the susceptor 12 through the processing space PS and the outer upper electrode 62 to the ground line such that this high frequency power does not flow to the variable DC power supply 82.

Further, the grounding member (DC ground electrode) 96 having a ring shape and made of a conductive member such as, but not limited to, Si or SiC is provided at a proper position facing the processing space PS within the chamber 10, for example, at an outside of the outer upper electrode 62 in the radial direction. The grounding member 96 is mounted to a ring-shaped insulator 98 made of, for example, ceramic and connected to a wall of the chamber 10. This grounding member 96 is always grounded via the chamber 10. If the DC voltages VC and VE are applied to the upper electrodes 60 and 62 from the variable DC power supplies 80 and 82, respectively, in the plasma processing, a DC electron current flows between the upper electrodes 60 and 62 and the grounding member 96 through the plasma.

Operations of the individual components of the plasma etching apparatus, for example, the exhaust device 26, the high frequency power supplies 30 and 32, the on/off switch 44 for electrostatic chuck, the processing gas supply 76, the on/off switches 84 and 90 for DC application, the chiller unit (not shown), the heat transfer gas supply (not shown), and so forth and an overall operation (sequence) of the plasma processing apparatus are controlled by a controller (not shown) which is implemented by, for example, a microcomputer.

In this plasma processing apparatus, to perform an etching, the gate valve 28 is opened, and the wafer W as the processing target object is carried into the chamber 10 and placed on the electrostatic chuck 40. Then, an etching gas (generally, a mixed gas) is introduced from the processing gas supply 76 into the chamber 10 at a preset flow rate, and an internal pressure of the chamber 10 is adjusted to a set value by the exhaust device 26. Further, the first and second high frequency power supplies 30 and 32 are turned on to output the first high frequency power (equal to or higher than 40 MHz) and the second high frequency power (equal to or less than 13.56 MHz) at preset power levels, and these first and second high frequency powers are applied to the susceptor 12 via the matching unit 34 and the power feed rod 36. Further, the switch 44 is turned on, and the heat transfer gas (He gas) is confined in a contact interface between the electrostatic chuck 40 and the wafer W by an electrostatic attracting force. The etching gas discharged from the shower head 60 is formed into plasma between the lower electrode 12 and the upper electrodes 60 and 62 by the discharge of the high frequency powers, and a processing target film on the surface of the wafer W is etched to have a required pattern by radicals or ions in this plasma.

The plasma processing apparatus 1 highly densifies the plasma in a desirable dissociated state by applying the first high frequency power having the relatively high frequency equal to or higher than 40 MHz suitable for plasma formation to the susceptor 12. Thus, the plasma processing apparatus 1 is capable of forming high-density plasma under a lower pressure condition. At the same time, by applying the second high frequency power having the relatively low frequency equal to or less than 13.56 MHz suitable for ion attraction to the susceptor 12, the plasma processing apparatus 1 is capable of carrying out anisotropic etching having high selectivity for the processing target film of the wafer W. Here, however, though the first high frequency power for plasma formation is always used in any plasma processing, the second high frequency power for ion attraction may not be used depending on a processing involved.

In this plasma processing apparatus 1, the first DC voltage VC and the second DC voltage VE are applied to the inner upper electrode 60 and the outer upper electrode 62 from the variable DC power supply 80 and the variable DC power supply 82, respectively, at the same time. By selecting a combination of these two DC voltages VC and VE appropriately, the uniformity of the plasma processing can be improved.

[Example Structure of Upper Electrode]

Figure 2:
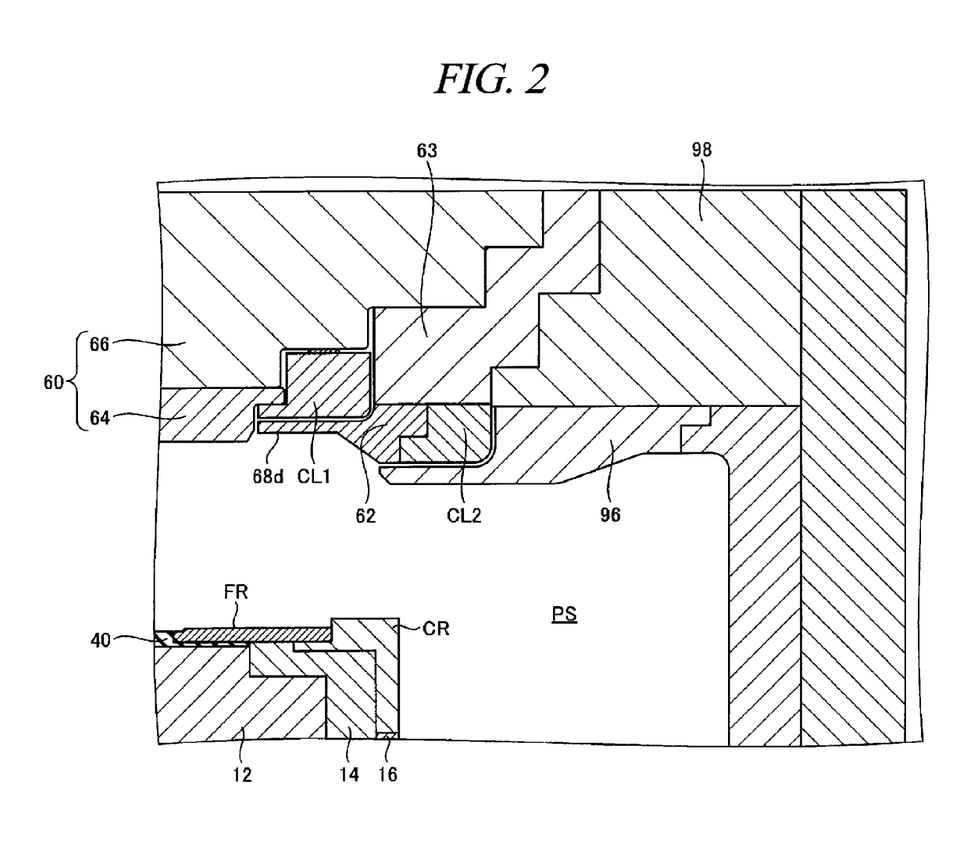
FIG. 2 is a diagram illustrating a detail of an example structure of an upper electrode of the plasma processing apparatus according to the exemplary embodiment.

FIG. 2 is a diagram illustrating an example structure of the upper electrodes 60 and 62 of the plasma processing apparatus 1 according to the exemplary embodiment in further detail. Though not particularly illustrated in FIG. 2, preset clearances are provided between the individual components.

As depicted in FIG. 2, in the present exemplary embodiment, at least a part of a surface of the outer upper electrode 62 exposed to the processing space PS is located higher than a surface of the inner upper electrode 60 exposed to the processing space PS. For example, the outer upper electrode 62 has a recess 68*d* recessed upwards.

As depicted in FIG. 2, the electrode plate 64 of the inner upper electrode 60 is coupled to the electrode support 66 by the clamp member CL1. The outer upper electrode 62 is disposed under the clamp member CL1 to surround an outer periphery of the inner upper electrode 60. The outer upper electrode 62 is coupled, at an outer peripheral side thereof, to the insulator 63 by the clamp member CL2. In consideration of thermal expansion of the individual components by heat of the plasma processing, the clamp members CL1 and CL2 are configured to clamp the inner upper electrode 60 and the outer upper electrode 62 without fixing them by screws or the like. Further, the grounding member 96 is disposed to extend outwards in the diametrical direction from near an outer periphery of the outer upper electrode 62 and from under the clamp member CL2. An outer peripheral portion of the grounding member 96 is connected to the sidewall of the chamber 10.

The susceptor 12 is disposed under the upper electrodes 60 and 62. The focus ring FR is placed at an outer peripheral portion of the electrostatic chuck 40 on the susceptor 12. The cover ring CR is disposed near an outer periphery of the focus ring FR, and the first support 14 and the cylindrical support 16 extend under the cover ring CR.

An inner portion of the outer upper electrode 62 of FIG. 2 in the diametrical direction is recessed toward the ceiling of the chamber 10 more than an outer portion thereof in the diametrical direction, so that the recess 68*d* is formed. The recess 68*d* is formed as an annular groove within a range from about 340 mm to about 385 mm in diameter of the upper electrodes 60 and 62. For example, the recess 68*d* is formed as a shape recessed about 3 mm from a surface of the electrode plate 64 of the inner upper electrode 60. Further, an outer peripheral portion of the outer upper electrode 62 has a taper shape, gradually protruding toward the processing space PS as it goes outward in the diametrical direction. The taper shape is formed at a position in a range from about 385 mm to about 405 mm in diameter. The taper-shaped outer peripheral portion of the outer upper electrode 62 protrudes toward the processing space PS to be lower than the surface of the electrode plate 64 of the inner upper electrode 60. The taper shape of the outer upper electrode 62 is gently led to a surface of the grounding member 96.

Further, in the example of FIG. 2, the electrode plate 64 of the inner upper electrode 60 has, at an outer peripheral portion thereof, a taper shape getting farther from the processing space PS as it goes from the inner side toward the outer side thereof. The taper shape of the electrode plate 64 is gently led to a surface of the recess 68*d* of the outer upper electrode 62.

As stated above, in the structure of FIG. 2, the processing space PS is enlarged in the vertical direction above the focus ring FR due to the taper shape of the inner upper electrode 60 and the recess 68*d* of the outer upper electrode 62. Accordingly, a large space in which the plasma easily enters is formed above the focus ring FR.

In the plasma processing apparatus 1 according to the exemplary embodiment as described above, a length of the processing space PS in the vertical direction in which the plasma is formed is increased due to the presence of the recess 68*d* of the outer upper electrode 62. Further, the length of the processing space PS in the vertical direction is narrowed at an outer peripheral side of the focus ring FR due to the taper shape formed at the outer side of the recess 68*d* of the outer upper electrode 62 in the diametrical direction. In this way, according to the exemplary embodiment, the large space in which the plasma is easily gathered is formed above the focus ring FR. Further, according to the exemplary embodiment, since the processing space PS is narrowed in the vertical direction at the outside of the focus ring FR in the diametrical direction, the plasma is confined in the space above the susceptor 12.

With this structure of the outer upper electrode 62, the plasma processing apparatus 1 according to the present exemplary embodiment is capable of improving the uniformity of the plasma processing by controlling the peak position of the plasma. Below, this effect of the present exemplary embodiment will be explained.

Effects of Exemplary Embodiment

Before the effect obtained by the structure of the outer upper electrode 62 according to the exemplary embodiment is explained, a tilt angle (outer tilt, inner tilt) in a plasma processing will be first explained.

[Description of Tilt Angle (Outer Tilt and Inner Tilt)]

As known in the art, when a plasma processing, for example, an etching processing is performed on different wafers by using the same plasma processing apparatus, an angle of a pattern formed at an edge portion of each wafer as a processing target object may be varied.

Figure 3A:
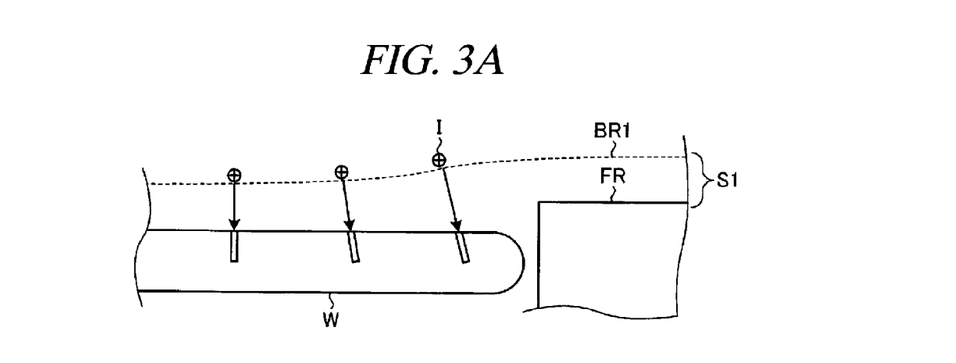
FIG. 3A is a diagram for describing a tilt angle (outer tilt) in a plasma processing.

FIG. 3A is a diagram for describing a tilt angle (outer tilt) in the plasma processing. FIG. 3A illustrates the outer tilt generated when the etching is performed on the wafer W. The focus ring FR is disposed around the wafer W. A top surface of the focus ring FR is higher than a top surface of the wafer W. In this case, at the edge portion of the wafer W, an interface BR1 of an ion sheath S1 generated in the plasma processing may be lowered as it goes inwards in the diametrical direction. Depending on an inclination of the interface BR1 of the ion sheath S1, an incident direction of ions I incident upon an edge of the wafer W forms an angle inclined toward the edge portion of the wafer W from a center thereof in a direction from the top surface of the wafer W toward a bottom surface thereof. Accordingly, a pattern formed by the etching is inclined outwards in the diametrical direction from the center thereof in the direction from the top surface of the wafer W toward the bottom surface thereof. This inclination angle is called the tilt angle. Further, at the edge portion of the wafer W, this formation of the pattern at the angle inclined outwards in the diametrical direction from the center thereof in the direction from the top surface of the wafer W toward the bottom surface thereof is called the outer tilt.

Figure 3B:
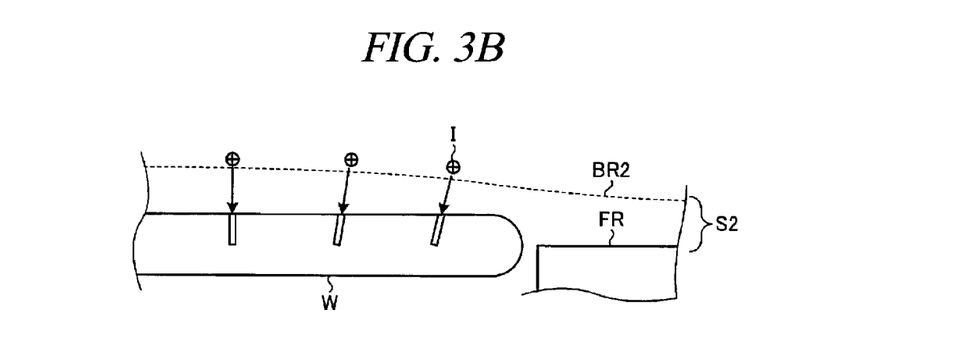
FIG. 3B is a diagram for describing a tilt angle (inner tilt) in a plasma processing.

FIG. 3B is a diagram for describing a tilt angle (inner tilt) in the plasma processing. In an example of FIG. 3B, the top surface of the focus ring FR is lower than the top surface of the wafer W. In this case, at the edge portion of the wafer W, an interface BR2 of an ion sheath S2 generated in the plasma processing may be gradually lowered as it goes outwards from the center of the wafer W in the diametrical direction. According to the interface BR2 of the ion sheath S2, the incident direction of the ions I in the plasma is inclined toward the center of the wafer W from the outer side thereof in the diametrical direction as it goes from the top surface of the wafer W toward the bottom surface thereof. Accordingly, a pattern formed by the etching is inclined toward the center of the wafer W from the outer side thereof in the diametrical direction as it goes from the top surface of the wafer W toward the bottom surface thereof. At the edge portion of the wafer W, this formation of the pattern at the angle inclined toward the center of the wafer W from the outer side thereof in the diametrical direction as it goes from the top surface of the wafer W toward the bottom surface thereof is called the inner tilt.

[Relationship Between Peak Position of Electron Density and Tilt Angle]

A thickness of the ion sheath relies on an electron density Ne, an electron temperature Te and a DC voltage Vdc. By way of example, the lower the electron density is and higher the electron temperature is, the larger the thickness of the ion sheath becomes. When the electron density Ne and the electron temperature Te are maintained constant, the ion sheath is thickened with a rise of a value of the DC voltage.

Figure 4:
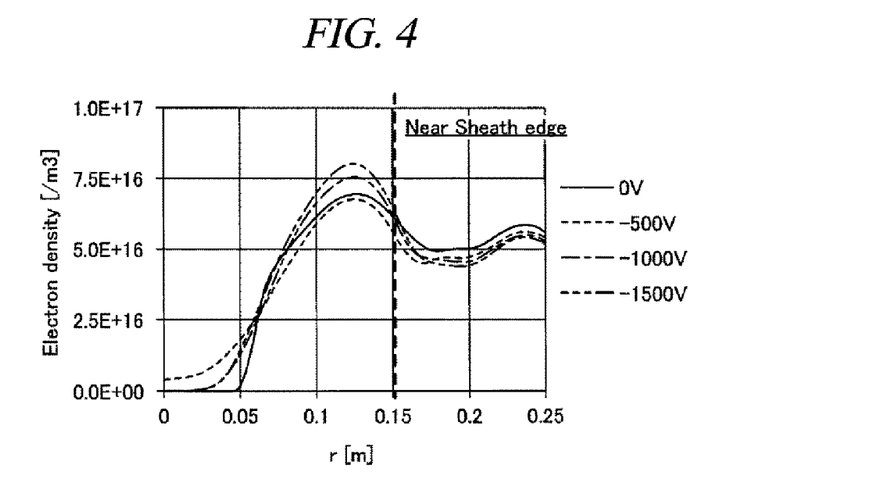
FIG. 4 is a graph showing a simulation result for a relationship between a voltage applied to an outer upper electrode and an electron density in a plasma processing apparatus according to a comparative example 1.

FIG. 4 is a graph showing a simulation result for a relationship between a voltage (application voltage) applied to an outer upper electrode OUTER and an electron density in a plasma processing apparatus according to a comparative example 1. Further, FIG. 5A to FIG. 5D are diagrams for describing a simulation result for an electron density distribution within a processing space of the plasma processing apparatus according to the comparative example 1. The outer upper electrode of the plasma processing apparatus of the comparative example 1 does not have a surface recessed upwards higher than a surface of an inner upper electrode, unlike the outer upper electrode of the exemplary embodiment. Instead, the surface of the outer upper electrode of the comparative example 1 protrudes toward the processing space when it goes outwards (see FIG. 5A to FIG. 5D).

As depicted in FIG. 4, in the plasma processing apparatus of the comparative example 1, regardless of the value of the DC voltage applied to the outer upper electrode OUTER, a peak of the electron density is found at a position of about 125 mm in radius of the wafer W (having a diameter of 300 mm). Further, it is found out that the electron density is lowered from the peak position as it goes inwards and outwards in the diametrical direction. As a result, there is generated an inflection point of the electron density near the edge of the wafer W.

Figure 5A:
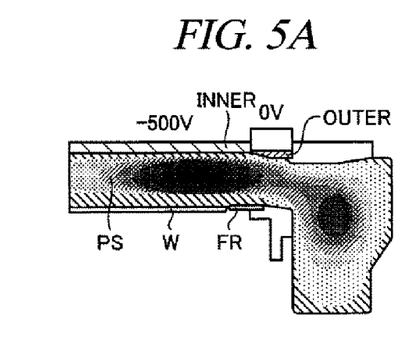
FIG. 5A to FIG. 5D are diagrams for describing a simulation result for an electron density distribution within a processing space of the plasma processing apparatus according to the comparative example 1.
Figure 5B:
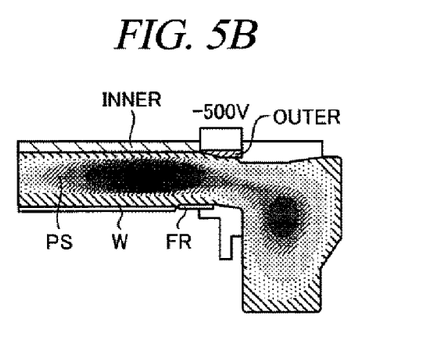
Figure 5C:
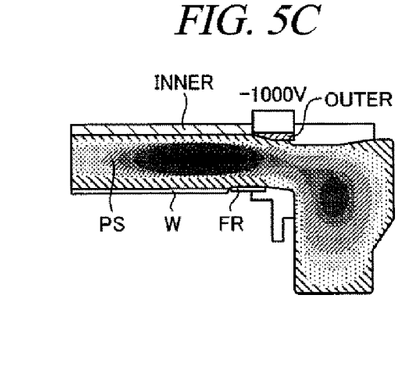
Figure 5D:
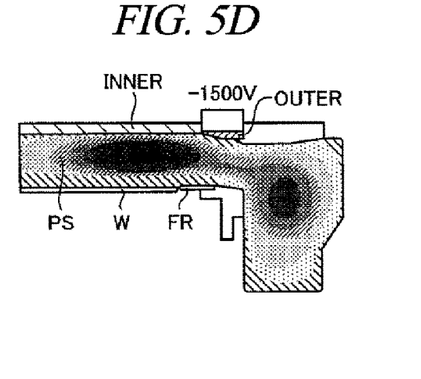

FIG. 5A illustrates a case where the application voltage to the outer upper electrode OUTER is 0 V. FIG. 5B illustrates a case where the application voltage to the outer upper electrode OUTER is −500 V. FIG. 5C illustrates a case where the application voltage to the outer upper electrode OUTER is −1000 V. FIG. 5D illustrates a case where the application voltage to the outer upper electrode OUTER is −1500 V. FIG. 5A to FIG. 5D show electron density distributions near the edge portion of the wafer W in the processing space PS, that is, with respect to a position between the outer upper electrode OUTER and the focus ring FR. In FIG. 5A to FIG. 5D, a hatched portion with a darker color indicates a higher electron density.

As can be seen from FIG. 5A to FIG. 5D, the plasma is gathered at the edge portion of the wafer W within the processing space PS regardless of the value of application voltage. Further, the plasma density is found to be lowered directly under the outer upper electrode OUTER. Here, it is deemed that the plasma density is lowered directly under the outer upper electrode OUTER because the processing space PS in this region is narrowed in the vertical direction. That is, the plasma tends to be gathered in a wider space.

In the plasma processing apparatus of the comparative example 1 shown in FIG. 5A to FIG. 5D, the space formed at a side of the placing table under the outer upper electrode OUTER, that is, formed between the components near the wafer W is narrowed, as compared to the space near the center of the wafer W. As a result, the plasma is moved to the larger space (toward the center of the wafer W). As can be seen from FIG. 5A to FIG. 5D, regardless of an absolute value of the application voltage, the electron density is once decreased under the outer upper electrode OUTER and is increased again at the outside of the outer upper electrode OUTER in the diametrical direction. Furthermore, as can be seen from FIG. 4, a peak value of the electron density is varied as the absolute value of the applied DC voltage is varied.

Figure 6:
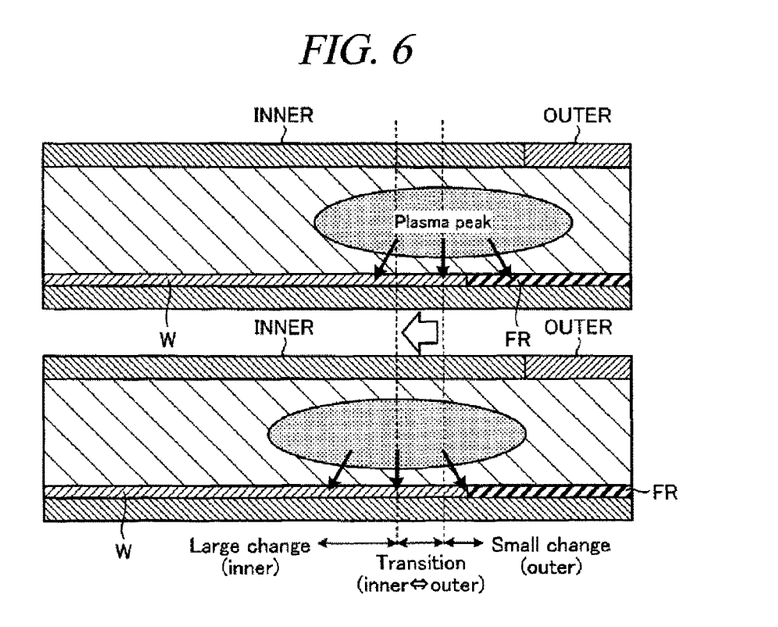
FIG. 6 is a diagram for describing a variation of the tilt angle.

FIG. 6 is a diagram for describing the variation of the tilt angle. Assume that the focus ring FR is disposed around the wafer W in the diametrical direction to surround the wafer W, as shown in an upper part of FIG. 6. Also, assume that, when the voltage is applied to the upper electrode, the peak of the electron density (plasma) is formed at a position approximately above the edge portion of the wafer W. In this case, the ion sheath above the edge portion of the wafer W is thinned. As a result, the outer tilt is generated from the peak position of the electron density as it goes outwards in the diametrical direction, and the inner tilt is generated from the peak position of the electron density as it goes inwards in the diametrical direction.

A lower part of FIG. 6 shows a case where the peak of the electron density is moved to an inner side of the wafer W in the diametrical direction, as compared to the example of the upper part of FIG. 6. As the peak position of the electron density is moved, a position where the ion sheath is thinned is moved to the inner side of the wafer W in the diametrical direction. As compared to the example of the upper part of FIG. 6, a position where the inner tilt is generated is moved to an inner side of the wafer W in the diametrical direction, and the outer tilt is generated at the edge portion of the wafer W where no tilt is generated in the example of the upper part of FIG. 6. Further, at the position where the outer tilt is already generated in the example of the upper part of FIG. 6, the tilt angle is increased. Further, at the position where the inner tilt is generated in the example of the upper part of FIG. 6, the angle of the inner tilt is changed. Furthermore, there may be a position where the inner tilt is changed into the outer tilt. As can be seen from this, if the peak position of the electron density is changed, the variation of the tilt angle is increased.

Further, as depicted in FIG. 4, the peak value of the electron density changes along with a variation of the absolute value of the applied DC voltage. Thus, in case of performing a control by varying the absolute value of the applied DC voltage, not only a direction (whether the inner tilt or the outer tilt) of the tilt angle but an amount of the tilt angle is also changed at the same position of the wafer W. Thus, in order to uniform the processing quality between the wafers W, a control range for the DC voltage applicable to the outer upper electrode is restricted.

Figure 7:
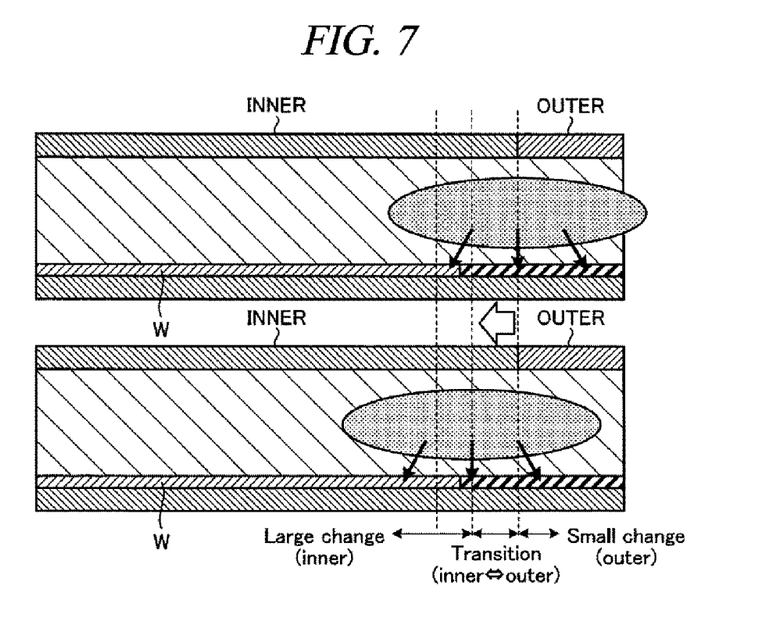
FIG. 7 is a diagram for describing an effect of improving the variation of the tilt angle when a peak position of the electron density is set at an outside of a surface of a wafer.

FIG. 7 is a diagram for describing an effect of improving the variation of the tilt angle when the peak position of the electron density is set to be the outside of the surface of the wafer W. In the plasma processing apparatus 1 according to the exemplary embodiment, by forming the recess 68d at the outer upper electrode 62, the peak of the electron density is generated at the position near the edge portion of the wafer W, more desirable, at the position outer than the edge portion of the wafer W in the diametrical direction. Referring to FIG. 7, an effect achieved when the peak of the electron density is generated at the position outside the wafer W in the diametrical direction will be explained.

An example of an upper part of FIG. 7 is the same as the example of the upper part of FIG. 6. In the example of the upper part of FIG. 7, the peak of the electron density of the plasma is located at the outside of the wafer W in the diametrical direction, not within the surface of the wafer W. Since the peak position of the electron density is located at the outside of the wafer W in the diametrical direction, a portion of the wafer W other than the edge thereof is not affected, though the inner tilt is generated near the edge of the wafer W.

In an example of a lower part of FIG. 7, the peak position of the electron density of the plasma is moved to the inner side of the wafer W in the diametrical direction. In the example of the lower part of FIG. 7, however, the peak position of the electron density does not exist on the surface of the wafer W. Thus, although the inner tilt is generated near the edge of the wafer W, no outer tilt is generated. In this way, by performing a control whereby the peak of the electron density is generated at the position outside the wafer W in the diametrical direction, the change of the tilt angle from the inner tilt to the outer tilt can be suppressed even in case that the peak is deviated toward the center of the wafer W.

[Effect of Recess of Outer Upper Electrode]

Figure 8:
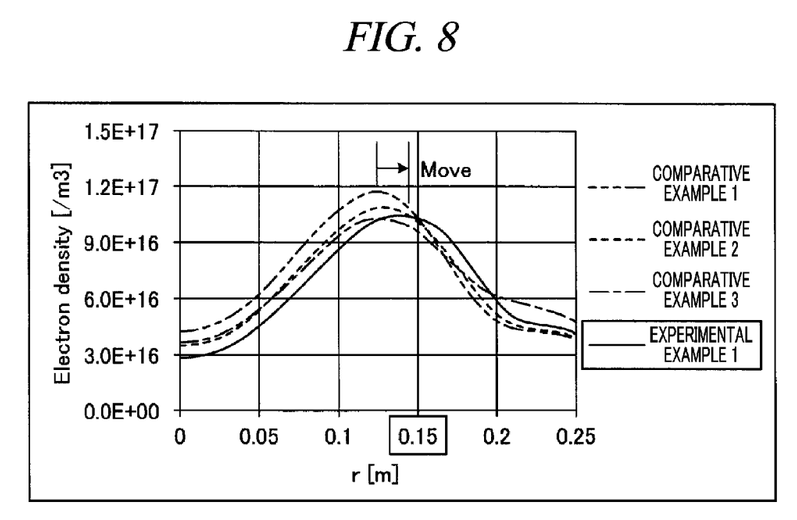
FIG. 8 is a diagram for describing simulation results for electron density distributions in plasma processing apparatuses according to comparative examples 1 to 3 and an experimental example 1.

FIG. 8 is a diagram for describing a simulation result for electron density distributions in the plasma processing apparatus of comparative examples 1 to 3 and an experimental example 1.

A plasma processing apparatus of the experimental example 1 is equipped with the outer upper electrode 62 having the recess 68d. The plasma processing apparatus of the experimental example 1, however, does not have the focus ring FR having the large diameter. A focus ring of the plasma processing apparatus of the experimental example 1 has an inner diameter of about 300 mm and an outer diameter of about 360 mm, the same as plasma processing apparatuses of the comparative examples 1 to 3.

Each of the plasma processing apparatuses of the comparative examples 1 to 3 is designed to generate the peak of the electron density near the outer periphery by setting the inner diameter and the outer diameter of the outer upper electrode to be large.

Differences in configurations of the plasma processing apparatuses of the comparative example 1 to 3 are as follows.

Comparative Example 1

Size of outer upper electrode: inner diameter of about 340 mm and outer diameter of about 400 mm Position of bottom surface of outer upper electrode: protruding about 5 mm toward susceptor to be lower than bottom surface of inner upper electrode Positional relationship between outer upper electrode and focus ring: inner end portion of outer upper electrode is located at position outer than center of focus ring in diametrical direction Comparative Example 2

Size of outer upper electrode: inner diameter of about 370 mm and outer diameter of about 400 mm Position of bottom surface of outer upper electrode: protruding about 5 mm toward susceptor to be lower than bottom surface of inner upper electrode (the same as in the comparative example 1)

Positional relationship between outer upper electrode and focus ring: inner diameter of outer upper electrode is larger than outer diameter of focus ring Comparative Example 3

Size of outer upper electrode: inner diameter of about 400 mm and outer diameter of about 430 mm Position of bottom surface of outer upper electrode: protruding about 5 mm toward susceptor to be lower than bottom surface of inner upper electrode (the same as in the comparative examples 1 and 2)

Positional relationship between outer upper electrode and focus ring: inner diameter of outer upper electrode is larger than outer diameter of focus ring Further, in the plasma processing apparatuses of the comparative examples 1 to 3, a size (diameter) of the inner upper electrode is adjusted along with the change in the size of the outer upper electrode.

A configuration of the plasma processing apparatus of the experimental example 1 is as follows.

Size of outer upper electrode: inner diameter of about 340 mm and outer diameter of about 400 mm Position of recess: located in a range from about 340 mm in inner diameter of outer upper electrode to about 380 mm Position of taper at outer peripheral side is located in a range from about 380 mm to about 400 mm in diameter A simulation result of investigating the electron density distributions in the plasma processing apparatuses of the experimental example 1 and the comparative examples 1 to 3 having the above-described configurations is shown in FIG. 8. As can be seen from FIG. 8, in the comparative example 1, the peak of the electron density is found at a position of about 125 mm in the diametrical direction. In the comparative example 2, though the peak position is deviated slightly outward in the diametrical direction as compared to that of the comparative example 1, the peak is still located at a position inner than the edge (a position of 150 mm in radius) in the diametrical direction. In the comparative example, 3, the peak position is hardly changed, as compared to the comparative examples 1 and 2.

Meanwhile, in the experimental example 1, the peak of the electron density is moved nearly to the edge (the position of 150 mm in radius). Further, in the experimental example 1, the recess 68d is recessed about 3 mm toward the ceiling of the chamber 10 as compared to the surface of the inner upper electrode. Further, the recess 68d is formed at a position ranging from about 340 mm to about 385 mm in diameter. Further, the taper shape of the outer upper electrode 62 is formed at a position ranging from about 385 mm to about 405 mm in diameter. Furthermore, an inclination angle of the taper shape is set to be about 30°. However, the size of the recess 68d is not limited thereto.

[Effect of Enlarging Diameter of Focus Ring]

Figure 9:
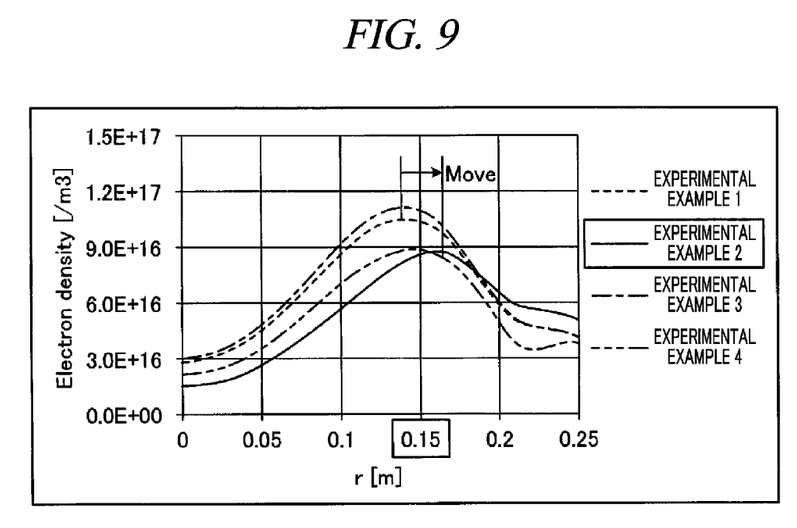
FIG. 9 is a diagram for describing a simulation result for the electron density distributions in the plasma processing apparatuses according to experimental examples 1 to 4.

FIG. 9 is a diagram for describing a simulation result for electron density distributions in plasma processing apparatuses according to experimental examples 1 to 4. Configurations of the plasma processing apparatuses of the experimental examples 1 to 4 are as follows.

Experimental Example 1 (the Same as the Experimental Example 1 of FIG. 8)

Size of focus ring: inner diameter of about 300 mm and outer diameter of about 360 mm Structure of outer upper electrode: having recess 68d of the exemplary embodiment Experimental Example 2 (FR with Large Diameter)

Size of focus ring: inner diameter of about 300 mm and outer diameter of about 380 mm Structure of outer upper electrode: having recess 68d of the exemplary embodiment (the same as in the experimental example 1)

Experimental Example 3 (FR with Small Diameter)

Size of focus ring: inner diameter of about 300 mm and outer diameter of about 330 mm Structure of outer upper electrode: having recess 68d of the exemplary embodiment (the same as in the experimental examples 1 and 2)

Experimental Example 4 (FR with Large Diameter, CR Having Large Diameter and Protruding Upwards)

Size of focus ring: inner diameter of about 300 mm and outer diameter of about 380 mm Structure of outer upper electrode: having recess 68d of the exemplary embodiment (the same as in the experimental examples 1 to 3)

Structure of cover ring CR: having outer diameter larger than those of the experimental examples 1 to 3 (about 460 mm) and having outer peripheral end protruding upwards (Length of processing space in vertical direction at CR end is shorter than those in the experimental examples 1 to 3)

The plasma processing apparatuses of the experimental examples 2 and 3 are designed to investigate whether variation of the size of the focus ring, particularly, the size of the outer diameter of the focus ring affects the distribution of the electron density. In the plasma processing apparatus of the experimental example 3, the diameter of the focus ring is set to be small, and by providing a groove between the focus ring and the cover ring, a distance between the focus ring and a structure thereabove is set to be long. Further, the plasma processing apparatus of the experimental example 4 is designed to investigate whether the configuration of the cover ring CR affects the electron density. The outer diameter of the focus ring of the plasma processing apparatus of the experimental example 2 is larger than that of the experimental example 1, and the outer diameter of the focus ring of the plasma processing apparatus of the experimental example 3 is smaller than that of the experimental example 1. Furthermore, though the focus ring of the plasma processing apparatus of the experimental example 4 has the size equal to that of the experimental example 2, the plasma processing apparatus of the experimental example 4 is designed to confine the plasma within the surface of the wafer by enlarging the outer diameter of the cover ring to thereby allow the outer peripheral end of the cover ring to protrude upwards.

The electron density distributions are investigated by simulation in the plasma processing apparatuses of the experimental examples 1 to 4 having the above-described configurations, and the result is shown in FIG. 9. As can be seen from FIG. 9, if the outer diameter of the focus ring is set to be small as in the experimental example 3, the peak position is hardly changed from the peak position in the experimental example 1. Further, in the experimental example 4, though the peak position is slightly moved toward the edge of the wafer W as compared to that in the experimental example 3, the peak position is still located within the surface of the wafer W. In contrast, in the experimental example 2, the peak position is moved to a position outer than the edge of the wafer W in the diametrical direction. From this result, it is found out that, by enlarging the outer diameter of the focus ring, the peak of the electron density can be moved to the outside of the wafer W in the diametrical direction. Further, the outer diameter of the focus ring is 360 mm in the experimental example 1, and the outer diameter of the focus ring is 380 mm in the experimental example 2. In view of this, it is deemed that, in order to move the peak of the electron density, the outer diameter of the focus ring desirably needs to be in a range from 360 mm to 380 mm, and, more desirably, in a range from 370 mm to 380 mm.

[Suppression of Variation of Tilt Angle]

Figure 10:
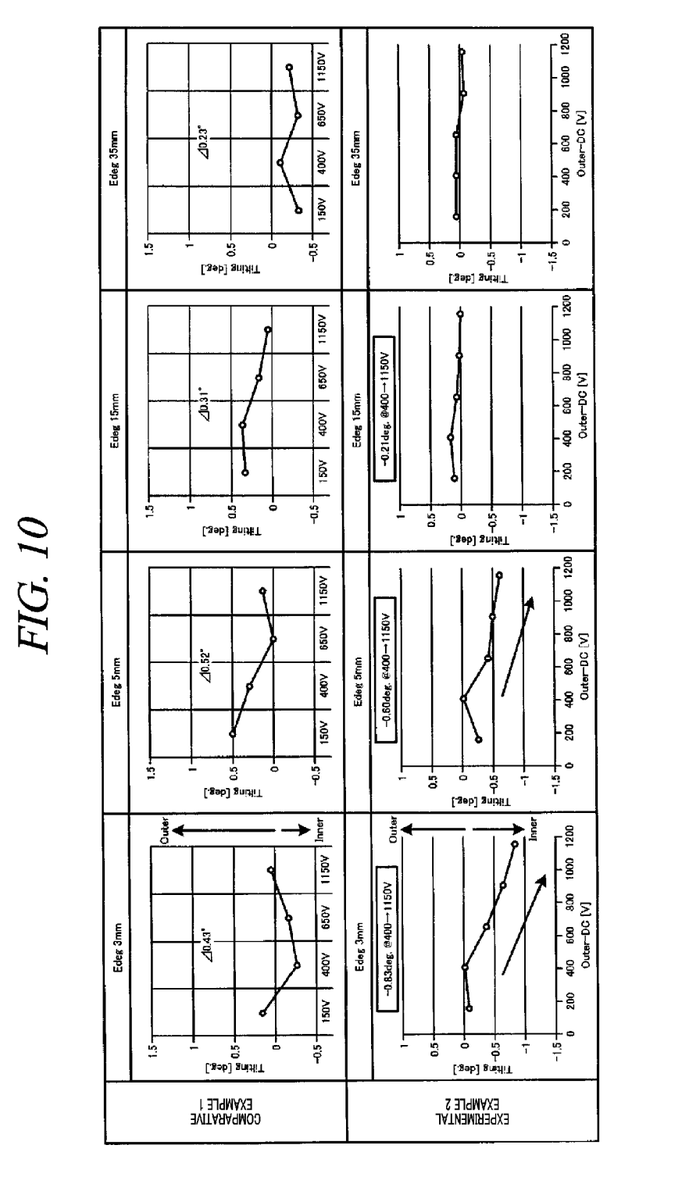
FIG. 10 is an experiment result illustrating an effect of improving a change of the tilt angle obtained by the plasma processing apparatus according to the exemplary embodiment.

FIG. 10 presents an experiment result showing an effect of improving the variation of the tilt angle obtained by the plasma processing apparatus according to the exemplary embodiment. Etching is performed in each of the plasma processing apparatus of the comparative example 1 and the plasma processing apparatus of the experimental example 2, and the variation of the tilt angle is investigated. The result is shown in FIG. 10.

First, the tilt angle is measured at a position 3 mm inwards from the edge of the wafer (periphery), while varying the value of the application voltage. Though the application voltage is a negative voltage, FIG. 10 shows an absolute value thereof. In the comparative example 1, the outer tilt and the inner tilt are generated, and the tilt angle is varied within a range of about 0.43 degree. In the experimental example 2, the absolute value of the application voltage is in a range from 400 V to 1150 V, and the variation of the tilt angle does not have the inflection point, which is the same at any of positions 5 mm, 15 mm and 35 mm inwards from the edge of the wafer. As compared to the comparative example 1 where the variation of the tilt angle has the inflection point, the variation of the tilt angle in the experimental example 2 is gentle especially at positions 15 mm and 35 mm from the edge even if the application voltage is changed. In this way, according to the experimental example 2, it is found out that even if the application voltage is changed, it is difficult to find the inflection point in the variation of the tilt angle. Further, it is also found out that the influence of tilting upon the portion other than the edge of the wafer is reduced.

The plasma processing apparatus according to the exemplary embodiment includes a processing vessel, a lower electrode, an annular member, an inner upper electrode, an outer upper electrode, a processing gas supply, a first high frequency power supply and a first DC power supply. The processing vessel is configured to be evacuated. The lower electrode is configured to place a processing target substrate within the processing vessel. The annular member is disposed on an outer peripheral portion of the lower electrode. The inner upper electrode is disposed to face the lower electrode within the processing vessel. The outer upper electrode is disposed in a ring shape at an outside of the inner upper electrode in a radial direction thereof within the processing vessel. Further, the outer upper electrode is electrically insulated from the inner upper electrode. The processing gas supply is configured to supply a processing gas into a processing space between the inner upper electrode and the outer upper electrode and the lower electrode. The first high frequency power supply is configured to apply, to the lower electrode or to the inner upper electrode and the outer upper electrode, a first high frequency power for forming plasma from the processing gas by a high frequency discharge. The first DC power supply is configured to apply a first variable DC voltage to the outer upper electrode. At least a part of a surface of the outer upper electrode exposed to the processing space is located higher than a surface of the inner upper electrode exposed to the processing space. Accordingly, in the plasma processing apparatus according to the exemplary embodiment, the peak position of the electron density in the plasma processing is controlled, and the peak of the electron density can be generated at a position above the outer periphery of the processing target substrate (wafer) or the outside the outer periphery of the processing target substrate in the diametrical direction. Therefore, the plasma processing apparatus of the exemplary embodiment is capable of improving the controllability over the tilting only at the edge portion of the wafer and reducing the influence of the tilting upon the portion of the wafer other than the edge portion. As a result, the plasma processing apparatus of the exemplary embodiment is capable of improving the uniformity of the plasma processing and, also, capable of improving MTBWC (Mean Time between Wet Cleaning) of the chamber.

In the plasma processing apparatus according to the exemplary embodiment, an outer peripheral portion of the outer upper electrode has a taper shape protruding toward the processing space as it goes outwards in a diametrical direction. Accordingly, the length of the processing space in the vertical direction can be shortened near the outer periphery of the outer upper electrode in the plasma processing apparatus, so that the plasma can be confined within the surface of the wafer.

In the plasma processing apparatus according to the exemplary embodiment, an outer peripheral portion of the inner upper electrode has a taper shape getting farther from the processing space as it goes outwards in a diametrical direction. Accordingly, in the plasma processing apparatus, this taper shape as well as the structure of the outer upper electrode enlarges the processing space near the edge portion of the wafer, so that the peak position of the electron density can be controlled.

The plasma processing apparatus according to the exemplary embodiment includes a clamp member and a grounding member. The clamp member is configured to hold the outer upper electrode. The grounding member is disposed closer to the processing space than the clamp member is.

In the plasma processing apparatus according to the exemplary embodiment, the outer upper electrode has a recess having a bottom surface recessed about 3 mm from the surface of the inner upper electrode.

In the plasma processing apparatus according to the exemplary embodiment, an outer diameter of the annular member is in a range from 360 mm to 380 mm.

The plasma processing apparatus according to the exemplary embodiment further includes a second DC power supply configured to apply a second variable DC voltage to the inner upper electrode.

The plasma processing apparatus according to the exemplary embodiment further includes a second high frequency power supply configured to apply, to the lower electrode, a second high frequency power for attracting an ion in plasma into the processing target substrate.

In a plasma processing method performed by a plasma processing apparatus according to the exemplary embodiment, a peak of an electron density in a plasma processing is formed at a position above an edge of the processing target substrate or a position at an outside of the edge of the processing target substrate in a diametrical direction.

According to the exemplary embodiment, it is possible to improve uniformity of a plasma processing by controlling a peak position of an electron density in the plasma processing.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting. The scope of the inventive concept is defined by the following claims and their equivalents rather than by the detailed description of the exemplary embodiments. It shall be understood that all modifications and embodiments conceived from the meaning and scope of the claims and their equivalents are included in the scope of the inventive concept.

We claim:

1. A plasma processing apparatus, comprising:
a processing vessel configured to be evacuated;
a lower electrode configured to place a processing target substrate within the processing vessel;
an annular member disposed on an outer peripheral portion of the lower electrode;
an inner upper electrode disposed to face the lower electrode within the processing vessel;
an outer upper electrode disposed in a ring shape at an outside of the inner upper electrode in a radial direction thereof within the processing vessel, the outer upper electrode being electrically insulated from the inner upper electrode;
a processing gas supply configured to supply a processing gas into a processing space between the inner upper electrode and the outer upper electrode and the lower electrode;
a first high frequency power supply configured to apply, to the lower electrode or to the inner upper electrode and the outer upper electrode, a first high frequency power for forming plasma from the processing gas by a high frequency discharge;
a first DC power supply configured to apply a first variable DC voltage to the outer upper electrode;
a clamp member configured to hold the outer upper electrode; and
a grounding member disposed closer to the processing space than the clamp member is,
wherein at least a part of a surface of the outer upper electrode exposed to the processing space is located higher than a surface of the inner upper electrode exposed to the processing space.

2. The plasma processing apparatus of claim 1,
wherein an outer peripheral portion of the outer upper electrode has a taper shape protruding toward the processing space as it goes outwards in a diametrical direction.

3. The plasma processing apparatus of claim 1,
wherein an outer peripheral portion of the inner upper electrode has a taper shape getting farther from the processing space as it goes outwards in a diametrical direction.

4. The plasma processing apparatus of claim 1,
wherein an outer diameter of the annular member is in a range from 360 mm to 380 mm.

5. The plasma processing apparatus of claim 1, further comprising:
a second DC power supply configured to apply a second variable DC voltage to the inner upper electrode.

6. The plasma processing apparatus of claim 1, further comprising:
a second high frequency power supply configured to apply, to the lower electrode, a second high frequency power for attracting an ion in plasma into the processing target substrate.

7. A plasma processing method performed by a plasma processing apparatus as claimed in claim 1,
wherein a peak of an electron density in a plasma processing is formed at a position above an edge of the processing target substrate or a position at an outside of the edge of the processing target substrate in a diametrical direction.

8. The plasma processing apparatus of claim 2,
wherein an outer peripheral portion of the inner upper electrode has a taper shape getting farther from the processing space as it goes outwards in a diametrical direction.

9. The plasma processing apparatus of claim 8,
wherein the outer upper electrode has a recess having a bottom surface recessed approximately 3 mm from the surface of the inner upper electrode.

10. The plasma processing apparatus of claim 9,
wherein an outer diameter of the annular member is in a range from 360 mm to 380 mm.

11. The plasma processing apparatus of claim 10, further comprising:
a second DC power supply configured to apply a second variable DC voltage to the inner upper electrode.

12. The plasma processing apparatus of claim 11, further comprising:
a second high frequency power supply configured to apply, to the lower electrode, a second high frequency power for attracting an ion in plasma into the processing target substrate.

13. A plasma processing apparatus, comprising:
a processing vessel configured to be evacuated;
a lower electrode configured to place a processing target substrate within the processing vessel;
an annular member disposed on an outer peripheral portion of the lower electrode;
an inner upper electrode disposed to face the lower electrode within the processing vessel;
an outer upper electrode disposed in a ring shape at an outside of the inner upper electrode in a radial direction thereof within the processing vessel, the outer upper electrode being electrically insulated from the inner upper electrode;
a processing gas supply configured to supply a processing gas into a processing space between the inner upper electrode and the outer upper electrode and the lower electrode;
a first high frequency power supply configured to apply, to the lower electrode or to the inner upper electrode and the outer upper electrode, a first high frequency power for forming plasma from the processing gas by a high frequency discharge; and
a first DC power supply configured to apply a first variable DC voltage to the outer upper electrode,
wherein at least a part of a surface of the outer upper electrode exposed to the processing space is located higher than a surface of the inner upper electrode exposed to the processing space, and
wherein the outer upper electrode has a recess having a bottom surface recessed about approximately 3 mm from the surface of the inner upper electrode.

14. The plasma processing apparatus, comprising:
a plasma processing chamber;
a susceptor disposed in the plasma processing chamber and having a substrate supporting region and an annular region that surrounds the substrate supporting region;
a ring disposed on the annular region of the susceptor;
an upper electrode disposed above the susceptor, a plasma processing space being defined between the susceptor and the upper electrode, the upper electrode including an inner electrode and an outer electrode surrounding the inner electrode, the outer electrode being electrically insulated from the inner electrode, the inner electrode having an inner exposed surface exposed to the plasma processing space, the outer electrode having an outer exposed surface exposed to the plasma processing space, at least a part of the outer exposed surface being disposed above the inner exposed surface;
a first DC power supply configured to apply a first variable DC voltage to the outer electrode;
a clamp holding the outer electrode; and
a grounding block disposed adjacent to a bottom surface and an outer side surface of the clamp.

15. The plasma processing apparatus of claim 14, wherein the outer exposed surface has an outwardly tapering protrusion in a radial direction.

16. The plasma processing apparatus of claim 15, wherein the inner exposed surface has an inwardly tapering protrusion in the radial direction.

17. The plasma processing apparatus of claim 14, wherein the outer exposed surface has an annular surface at a level approximately 3 mm above the inner exposed surface.

* * * * *